United States Patent
Yao et al.

(10) Patent No.: US 10,885,965 B2
(45) Date of Patent: Jan. 5, 2021

(54) MEMCAPACITOR, PROGRAMMING METHOD FOR MEMCAPACITOR AND CAPACITIVE RANDOM ACCESS MEMORY

(71) Applicant: SHENZHEN GOODIX TECHNOLOGY CO., LTD., Shenzhen (CN)

(72) Inventors: Guofeng Yao, Shenzhen (CN); Jian Shen, Shenzhen (CN)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 16/687,694

(22) Filed: Nov. 19, 2019

(65) Prior Publication Data

US 2020/0143864 A1    May 7, 2020

Related U.S. Application Data

(63) Continuation of application No. PCT/CN2018/113978, filed on Nov. 5, 2018.

(51) Int. Cl.
*G11C 11/24* (2006.01)
*H01L 45/00* (2006.01)
(Continued)

(52) U.S. Cl.
CPC .......... *G11C 11/24* (2013.01); *G11C 13/0011* (2013.01); *G11C 13/0069* (2013.01);
(Continued)

(58) Field of Classification Search
CPC . G11C 11/24; G11C 13/0011; G11C 13/0069; G11C 2013/009; H01L 28/60;
(Continued)

(56) References Cited

U.S. PATENT DOCUMENTS

| | | | |
|---|---|---|---|
| 5,761,115 A | 6/1998 | Kozicki et al. | |
| 5,896,312 A | 4/1999 | Kozicki et al. | |

(Continued)

FOREIGN PATENT DOCUMENTS

| | | |
|---|---|---|
| CN | 1144231 C | 3/2004 |
| CN | 102763219 A | 10/2012 |

(Continued)

OTHER PUBLICATIONS

Yin et al, "What are Memristor, Memcapcitor, and Meminductor?", Apr. 2015, IEEE Transaction on Circuits & Systems, vol. 62, No. 4, pp. 402-406. (Year: 2015).*

*Primary Examiner* — Viet Q Nguyen

(57) ABSTRACT

Embodiments of the present disclosure provide a memcapacitor, a programming method for a memcapacitor and a capacitive random access memory. The memcapacitor includes: a source electrode made of a metal material; a first dielectric layer disposed at an outer side of the source electrode in a horizontal direction; a programming electrode disposed at an outer side of the first dielectric layer in the horizontal direction; a second dielectric layer disposed at an upper surface of the source electrode and an upper surface of the first dielectric layer; and a reading electrode disposed at an upper surface of the second dielectric layer, where the reading electrode, the second dielectric layer and the source electrode form a capacitor.

20 Claims, 5 Drawing Sheets

(51) Int. Cl.
*H01L 49/02* (2006.01)
*G11C 13/00* (2006.01)

(52) U.S. Cl.
CPC ............ *H01L 28/60* (2013.01); *H01L 45/085* (2013.01); *H01L 45/1206* (2013.01); *H01L 45/1266* (2013.01); *G11C 2013/009* (2013.01)

(58) Field of Classification Search
CPC .......................... H01L 45/085; H01L 45/1206; H01L 45/1266
USPC ......................................................... 365/149
See application file for complete search history.

(56) References Cited

U.S. PATENT DOCUMENTS

| | | | |
|---|---|---|---|
| 5,914,893 A | 6/1999 | Kozicki et al. | |
| 6,084,796 A | 7/2000 | Kozicki et al. | |
| 8,537,597 B2* | 9/2013 | Kushida | G11C 13/004 |
| | | | 365/148 |
| 8,750,024 B2* | 6/2014 | Bratkovski | G11C 13/0002 |
| | | | 365/149 |
| 8,799,848 B1* | 8/2014 | Haensch | G06F 30/367 |
| | | | 716/136 |
| 8,835,272 B1* | 9/2014 | Mickel | H01L 45/085 |
| | | | 438/382 |
| 10,162,263 B2* | 12/2018 | Ge | H01L 45/08 |
| 10,622,159 B2* | 4/2020 | Carver | H01G 4/06 |
| 2008/0273370 A1 | 11/2008 | Keller et al. | |
| 2011/0199814 A1* | 8/2011 | Meade | G11C 13/0061 |
| | | | 365/149 |
| 2011/0199815 A1* | 8/2011 | Meade | G11C 13/0007 |
| | | | 365/149 |
| 2012/0014170 A1* | 1/2012 | Strukov | G11C 11/24 |
| | | | 365/149 |
| 2012/0039114 A1* | 2/2012 | Bratkovski | H01G 4/1272 |
| | | | 365/149 |
| 2012/0146184 A1* | 6/2012 | Pickett | H01G 7/06 |
| | | | 257/532 |
| 2013/0242637 A1* | 9/2013 | Yang | H01L 45/12 |
| | | | 365/148 |
| 2015/0041751 A1* | 2/2015 | Zhang | H01L 29/92 |
| | | | 257/4 |
| 2016/0267379 A1* | 9/2016 | Eleftheriou | G06N 3/049 |
| 2018/0082168 A1* | 3/2018 | Marukame | H01L 27/2463 |
| 2018/0268970 A1 | 9/2018 | Ham et al. | |

FOREIGN PATENT DOCUMENTS

| | | |
|---|---|---|
| CN | 105679840 A | 6/2016 |
| EP | 0939957 B1 | 8/2005 |
| WO | 2010147588 A1 | 12/2010 |

\* cited by examiner

70

| applying a voltage difference between the source electrode and the programming electrode to change an effective electrode area of the capacitor | — S71 |

FIG. 11 capacitive random access memory 80 memcapacitor array 81

FIG. 12

MEMCAPACITOR, PROGRAMMING METHOD FOR MEMCAPACITOR AND CAPACITIVE RANDOM ACCESS MEMORY

CROSS REFERENCE TO RELATED APPLICATIONS

The present disclosure is a continuation of international application No. PCT/CN2018/113978, filed on Nov. 5, 2018, which is hereby incorporated by reference in its entirety.

TECHNICAL FIELD

Embodiments of the present disclosure relate to the field of semiconductor manufacturing technologies, and in particular, to a memcapacitor, a programming method for a memcapacitor and a capacitive random access memory.

BACKGROUND

A non-volatile memory (NVM) mainly includes two types: a capacitive random access memory (CRAM) and a resistive random access memory (RRAM). The CRAM has an advantage of low power consumption with respect to the RRAM and is receiving more and more attention.

A basic storage unit of the CRAM is a memcapacitor, a working principle of which is to adjust and control a thickness of an effective dielectric layer of the memcapacitor by an external electric field, thereby changing a capacitance value of the memcapcitor, and achieving switching of different storage states of the CRAM, for example, "0" and "1". However, in this way, requirements for a material of the dielectric layer are relatively high, and therefore a preparation process is relatively complicated.

SUMMARY

Embodiments of the present disclosure provide a memcapacitor, a programming method for a memcapacitor and a capacitive random access memory, and an effective electrode area of a capacitor is changed by migration of metal cations, thereby achieving switching of different storage states of the memcapacitor.

In a first aspect, provided is a memcapacitor including: a source electrode made of a metal material;

a first dielectric layer disposed at an outer side of the source electrode in a horizontal direction;

a programming electrode disposed at an outer side of the first dielectric layer in the horizontal direction;

a second dielectric layer disposed at an upper surface of the source electrode and an upper surface of the first dielectric layer; and a reading electrode disposed at an upper surface of the second dielectric layer, where the reading electrode, the second dielectric layer and the source electrode form a capacitor.

In some possible implementation manners, the memcapacitor further includes:

a third dielectric layer disposed at a lower surface of the source electrode and a lower surface of the first dielectric layer; and a conductive through hole disposed in the third dielectric layer and located under the source electrode for connecting the source electrode to an external voltage.

In some possible implementation manners, the third dielectric layer at least covers the lower surface of the source electrode and the lower surface of the first dielectric layer.

In some possible implementation manners, mobility of metal cations in the source electrode in the first dielectric layer is greater than mobility of the metal cations in the second dielectric layer, and the mobility of the metal cations in the first dielectric layer is greater than mobility of the metal cations in the third dielectric layer.

In some possible implementation manners, a ratio of the mobility of the metal cations in the first dielectric layer to the mobility of the metal cations in the second dielectric layer is greater than or equal to 10, and a ratio of the mobility of the metal cations in the first dielectric layer to the mobility of the metal cations in the third dielectric layer is greater than or equal to 10.

In some possible implementation manners, the second dielectric layer at least covers the upper surface of the source electrode and the upper surface of the first dielectric layer.

Optionally, an area of a lower surface of the reading electrode is larger than twice an area of the upper surface of the source electrode in a case that there is no voltage difference between the source electrode and the programming electrode.

In some possible implementation manners, a thickness of the first dielectric layer ranges from 10 to 100 times a radius of a metal cation in the source electrode.

In some possible implementation manners, the memcapacitor further includes:

a driving module configured to control, by applying a voltage signal to the programming electrode, metal cations in the source electrode to migrate in the horizontal direction so as to change an effective electrode area of the capacitor, where different capacitance values of the capacitor correspond to different storage states of the memcapacitor.

In some possible implementation manners, the driving module is specifically configured to:

control, by controlling a voltage parameter of the voltage signal applied to the programming electrode, a migration distance of the metal cations in the horizontal direction so as to control the effective electrode area of the capacitor.

In some possible implementation manners, the voltage parameter includes a type of voltage and/or a corresponding control parameter, the type of voltage is a direct current voltage or a pulse voltage, a control parameter of the direct current voltage includes at least one of a voltage amplitude, a voltage applying time and a voltage applying manner, and a control parameter of the pulse voltage includes at least one of a number of pulse voltages, an amplitude and a width of the pulse voltage.

In some possible implementation manners, the driving module is specifically configured to:

input a first voltage signal to the programming electrode during a first time period, where a voltage value of the first voltage signal is less than zero, the source electrode is grounded, the metal cations in the source electrode migrate outward in the horizontal direction, and a size of the source electrode in the horizontal direction is increased from a first size to a second size;

disconnect the first voltage signal during a second time period, where the metal cations in the source electrode stop migrating, and the size of the source electrode in the horizontal direction is reduced from the second size to a second effective size, where a capacitance value of the capacitor corresponds to a first storage state of at least two storage states of the memcapacitor when the size of the source electrode in the horizontal direction is the second effective size; or input a second voltage signal to the programming electrode during a third time period, where a voltage value of the second voltage signal is greater than zero, the source electrode is grounded, the metal cations in the source electrode migrate inward in the horizontal direction, and the size of the source electrode in the horizontal direction is reduced from a third size to a fourth size; and disconnect the second voltage signal during a fourth time period, where the metal cations in the source electrode stop migrating, and the size of the source electrode in the horizontal direction is increased from the fourth size to a fourth effective size, where the capacitance value of the capacitor corresponds to a second storage state of the at least two storage states of the memcapacitor when the size of the source electrode in the horizontal direction is the fourth effective size.

In some possible implementation manners, the at least two storage states include a storage state 0 and a storage state 1, the first storage state is the storage state 1, and the second storage state is the storage state 0.

In some possible implementation manners, the reading electrode is connected with the programming electrode.

In some possible implementation manners, the reading electrode and the programming electrode are connected as one electrode in a case that a ratio of a program voltage to a read voltage is greater than or equal to 10.

In some possible implementation manners, the first dielectric layer surrounds the source electrode, and the programming electrode surrounds the first dielectric layer.

In some possible implementation manners, a thickness of the first dielectric layer is the same as a thickness of the source electrode, and a thickness of the programming electrode is the same as the thickness of the source electrode.

In a second aspect, provided is a programming method for a memcapacitor, and the memcapacitor includes: a source electrode made of a metal material; a first dielectric layer disposed at an outer side of the source electrode in a horizontal direction; a programming electrode disposed at an outer side of the first dielectric layer in the horizontal direction; a second dielectric layer disposed at an upper surface of the source electrode and an upper surface of the first dielectric layer; and a reading electrode disposed at an upper surface of the second dielectric layer, where the reading electrode, the second dielectric layer and the source electrode form a capacitor; and the method includes: applying a voltage difference between the source electrode and the programming electrode to change an effective electrode area of the capacitor.

In some possible implementation manners, the applying the voltage difference between the source electrode and the programming electrode to change the effective electrode area of the capacitor includes:

controlling, by controlling a voltage parameter of a voltage signal applied to the programming electrode, a migration distance of metal cations in the source electrode in the horizontal direction so as to control the effective electrode area of the capacitor, where different capacitance values of the capacitor correspond to different storage states of the memcapacitor.

In some possible implementation manners, the voltage parameter includes a type of voltage and/or a corresponding control parameter, the type of voltage is a direct current voltage or a pulse voltage, a control parameter of the direct current voltage includes at least one of a voltage amplitude, a voltage applying time and a voltage applying manner, and a control parameter of the pulse voltage includes at least one of a number of pulse voltages, an amplitude and a width of the pulse voltage.

Optionally, the controlling, by controlling the voltage parameter of the voltage signal applied to the programming electrode, the migration distance of the metal cations in the source electrode in the horizontal direction includes:

inputting a first voltage signal to the programming electrode during a first time period, where a voltage value of the first voltage signal is less than zero, the source electrode is grounded, the metal cations in the source electrode migrate outward in the horizontal direction, and a size of the source electrode in the horizontal direction is increased from a first size to a second size;

disconnecting the first voltage signal during a second time period, where the metal cations in the source electrode stop migrating, and the size of the source electrode in the horizontal direction is reduced from the second size to a second effective size, where a capacitance value of the capacitor corresponds to a first storage state of at least two storage states of the memcapacitor when the size of the source electrode in the horizontal direction is the second effective size; or inputting a second voltage signal to the programming electrode during a third time period, where a voltage value of the second voltage signal is greater than zero, the source electrode is grounded, the metal cations in the source electrode migrate inward in the horizontal direction, and the size of the source electrode in the horizontal direction is reduced from a third size to a fourth size; and disconnecting the second voltage signal during a fourth time period, where the metal cations in the source electrode stop migrating, and the size of the source electrode in the horizontal direction is increased from the fourth size to a fourth effective size, where the capacitance value of the capacitor corresponds to a second storage state of the at least two storage states of the memcapacitor when the size of the source electrode in the horizontal direction is the fourth effective size. In some possible implementation manners, the at least two storage states include a storage state 0 and a storage state 1, the first storage state is the storage state 1, and the second storage state is the storage state 0.

Optionally, the controlling, by controlling the voltage parameter of the voltage signal applied to the programming electrode, the migration distance of the metal cations in the source electrode in the horizontal direction includes:

controlling, by controlling the voltage parameter of the voltage signal input to the programming electrode, a maximum migration distance of the metal cations in the first dielectric layer to be not more than 70% of a size of the first dielectric layer in the horizontal direction.

In some possible implementation manners, the memcapacitor further includes:

a third dielectric layer disposed at a lower surface of the source electrode and a lower surface of the first dielectric layer; and a conductive through hole disposed in the third dielectric layer and located under the source electrode for connecting the source electrode to an external voltage.

In some possible implementation manners, mobility of metal cations in the source electrode in the first dielectric layer is greater than mobility of the metal cations in the second dielectric layer, and the mobility of the metal cations in the first dielectric layer is greater than mobility of the metal cations in the third dielectric layer.

In some possible implementation manners, a ratio of the mobility of the metal cations in the first dielectric layer to the mobility of the metal cations in the second dielectric layer is greater than or equal to 10, and a ratio of the mobility of the metal cations in the first dielectric layer to the mobility of the metal cations in the third dielectric layer is greater than or equal to 10.

In some possible implementation manners, the reading electrode is connected with the programming electrode.

In some possible implementation manners, the reading electrode and the programming electrode are connected as one electrode in a case that a ratio of a program voltage to a read voltage is greater than or equal to 10.

In some possible implementation manners, the first dielectric layer surrounds the source electrode, and the programming electrode surrounds the first dielectric layer.

In some possible implementation manners, a thickness of the first dielectric layer is the same as a thickness of the source electrode, and a thickness of the programming electrode is the same as the thickness of the source electrode.

In a third aspect, provided is a capacitive random access memory including a memcapacitor array, where the memcapacitor array is an array composed of a plurality of memcapacitors according to the first aspect or any one of possible implementation manners of the first aspect.

BRIEF DESCRIPTION OF DRAWINGS

FIG. 11 is a schematic flow chart of a programming method for a memcapacitor according to an embodiment of the present disclosure.

FIG. 12 is a schematic structural diagram of a capacitive random access memory according to an embodiment of the present disclosure.

DESCRIPTION OF EMBODIMENTS

A clear description of technical solutions of embodiments of the present disclosure will be given below with reference to the accompanying drawings in the embodiments of the present disclosure.

Structures and working principles of a memcapacitor according to the embodiments of the present disclosure will be described below with reference to FIG. 1 to FIG. 10. It should be understood that the memcapacitor structures shown in the embodiments of the present disclosure are merely examples, and the memcapacitor of the embodiments of the present disclosure may be of other deformation structures, which are not particularly limited in the embodiments of the present disclosure.

It should be noted that, to facilitate understanding, in the embodiments shown below, for the structures shown in different embodiments, the same structures are denoted by the same reference numbers, and a detailed explanation for the same structure is omitted for brevity.

It should be understood that heights or thicknesses of various structural members in the memcapacitor structures and overall thicknesses of the memcapacitor structures in the embodiments of the present disclosure shown below are merely illustrative, and should not constitute any limitation to the present disclosure.

Figure 1:
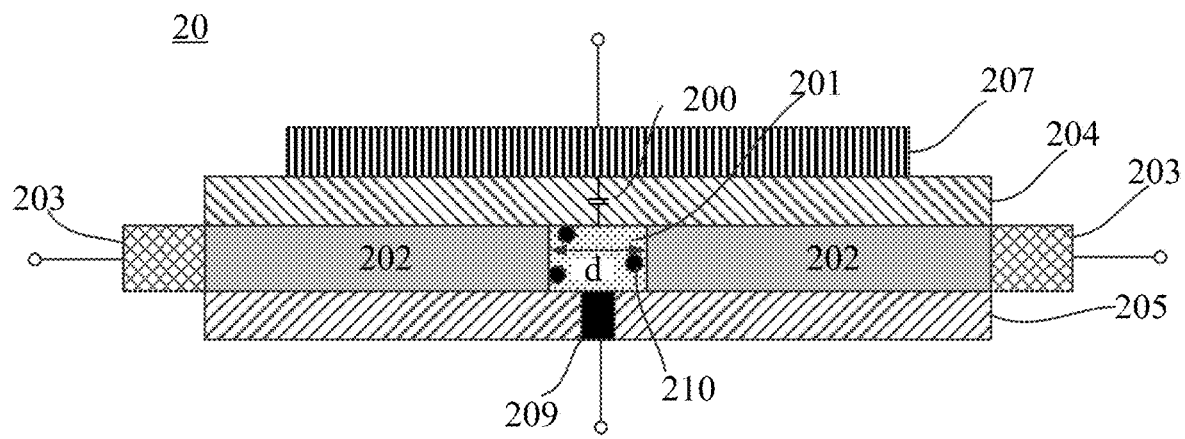
FIG. 1 is a schematic structural diagram of a memcapacitor according to an embodiment of the present disclosure.

FIG. 1 is a schematic structural diagram of a memcapacitor according to an embodiment of the present disclosure. As shown in FIG. 1, a memcapacitor 20 includes:

a source electrode 201 made of a metal material;

a first dielectric layer 202 disposed at an outer side of the source electrode 201 in a horizontal direction;

a programming electrode 203 disposed at an outer side of the first dielectric layer 202 in the horizontal direction;

a second dielectric layer 204 disposed at an upper surface of the source electrode 201 and an upper surface of the first dielectric layer 202; and a reading electrode 207 disposed at an upper surface of the second dielectric layer 204, where the reading electrode 207, the second dielectric layer 204 and the source electrode 201 form a capacitor 200.

It should be understood that when there is a voltage difference between the source electrode 201 and the programming electrode 203, metal in the source electrode 201 is oxidized, and the generated metal cations 210 migrate in the horizontal direction, are generally reduced by electrons drifting from the programming electrode 203 during the migration process and returned to a metal state, and become an extension portion of the source electrode 201 in the first dielectric layer 202, thereby changing an effective electrode area of the capacitor 200, that is, changing a capacitance value of the capacitor 200.

Optionally, in the embodiment of the present disclosure, the memcapacitor 20 may further include a third dielectric layer 205 and a conductive through hole 209, where the conductive through hole 209 is disposed in the third dielectric layer 205 and located under the source electrode 201 for achieving a connection between the source electrode 201 and an external voltage. For example, the source electrode 201 is grounded.

Specifically, the source electrode 201 is the metal material. When there is the voltage difference between the source electrode 201 and the programming electrode 203, the metal in the source electrode 201 is oxidized, and the metal cations 210 generated may directionally migrate in the first dielectric layer 202 in the horizontal direction, is generally reduced to a metal state by the electrons drifting from the programming electrode 203 during the migration process, and becomes the extension portion of the source electrode 201 in the first dielectric layer 202, thereby changing an effective area of the source electrode 201 in the horizontal direction.

In the embodiment of the present disclosure, the source electrode 201, the second dielectric layer 204 and the reading electrode 207 form a capacitor 200, the reading electrode 207 and the source electrode 201 may be regarded as upper and lower plates of the capacitor 200, and then effective areas of the source electrode 201 and the reading electrode 207 may determine the effective electrode area of the capacitor 200, that is, the capacitance value of the capacitor 200.

It should be understood that an effective electrode area of a capacitor is generally determined by the smaller of effective areas of upper and lower plates. In the embodiment of the present disclosure, when the metal cations 210 in the source electrode 201 do not migrate, the effective area of the reading electrode 207 may be set to be larger than the effective area of the source electrode 201, and in this case, the effective electrode area of the capacitor 200 is determined by the effective area of the source electrode 201. Therefore, the effective electrode area of the capacitor 200 may be changed by changing the effective area of the source electrode 201 in the horizontal direction, thereby changing the capacitance value of the capacitor 200.

Optionally, in a specific embodiment, when there is no voltage difference between the programming electrode 203 and the source electrode 201 (in other words, the metal cations 210 in the source electrode 201 do not migrate), the effective area of the reading electrode 207 is larger than K times the effective area of the source electrode 201. Optionally, K may be 2, 3 or the like.

By setting that when there is no voltage difference between the programming electrode 203 and the source electrode 201, the effective area of the reading electrode 207 is larger than K times the effective area of the source electrode 201, the effective area of the source electrode 201 is not larger than an area of the reading electrode when increasing, which results in that the effective electrode area of the capacitor is limited by the effective area of the reading electrode 207.

It can be understood that the effective area of the reading electrode is an area of a lower surface of the reading electrode in contact with the second dielectric layer, and the effective area of the source electrode is an area of the upper surface of the source electrode in contact with the second dielectric layer.

In the embodiment of the present disclosure, different capacitance values of the capacitor 200 may be set to correspond to different storage states of the memcapacitor. It is assumed that the capacitor 200 has two states of a high capacitance value and a low capacitance value, and the two states may be set to correspond to storage states "1" and "0". For example, when the capacitance value of the capacitor 200 is a first value (corresponding to the high capacitance value), it may be set to correspond to the storage state "1", and when the capacitance value of the capacitor 200 is a second value (corresponding to the low capacitance value), it may be set to correspond to the storage state "0". Thus, by controlling the voltage difference between the source electrode 201 and the programming electrode 203, the capacitance value of the capacitor is the first value or the second value, thereby achieving writing of "0" or "1" in the memcapacitor.

In a specific implementation, the voltage difference between the programming electrode 203 and the source electrode 201 may be controlled to be a negative value. For example, the source electrode 201 is grounded, and a voltage signal less than zero is applied to the programming electrode 203. In this case, the metal cations 210 in the source electrode 201 migrate outward in the first dielectric layer 202, that is, in a direction of the programming electrode 203, and an effective size of the source electrode is increased or the effective area of the source electrode is increased. That is, the effective electrode area of the capacitor is increased, the capacitance value of the capacitor is then increased, and the capacitance value of the capacitor at this time may be set to be the high capacitance value (or referred to as a high capacitance status), which corresponds to the storage state "1".

Correspondingly, the voltage difference between the programming electrode 203 and the source electrode 201 may be controlled to be a positive value. For example, the source electrode 201 is grounded, and a voltage signal greater than zero is applied to the programming electrode 203. In this case, the metal cations 210 in the source electrode 201 migrate inward, that is, in a direction away from the programming electrode 203, and the effective size of the source electrode is reduced or the effective area of the source electrode is reduced. That is, the effective electrode area of the capacitor is reduced, the capacitance value of the capacitor is then reduced, and the capacitance value of the capacitor at this time may be set to be the low capacitance value (or referred to as a low capacitance status), which corresponds to the storage state "0".

It should be noted that, in the embodiment of the present disclosure, the capacitor 200 may further have more capacitance value status, which correspond to more storage states of the memcapacitor, and thus more storage states of the memcapacitor could be achieved by controlling the capacitor 200 to be more capacitance value status. For example, the capacitor 200 may have four capacitance value status, which correspond to four storage states of the memcapacitor: "00", "01", "10" and "11". The capacitor is in the foregoing four capacitance value status by controlling the voltage difference between the source electrode 201 and the programming electrode 203, and thus the foregoing four storage states of the memcapacitor could be achieved.

It should be understood that, in the embodiment of the present disclosure, each capacitance value state of the capacitor 200, for example, may be a specific capacitance value, or may be a specific capacitance value range. Then, the capacitance value of the capacitor 200 may be set to correspond to a certain specific storage state when being the specific capacitance value, or the capacitance value of the capacitance may be set to correspond to a certain specific storage state when falling within the specific capacitance value range, which is not limited in the embodiment of the present disclosure.

Working principles of two-level storage (that is, storage states "0" and "1") of the memcapacitor will be described below with reference to FIG. 2 to FIG. 6.

Figure 2:
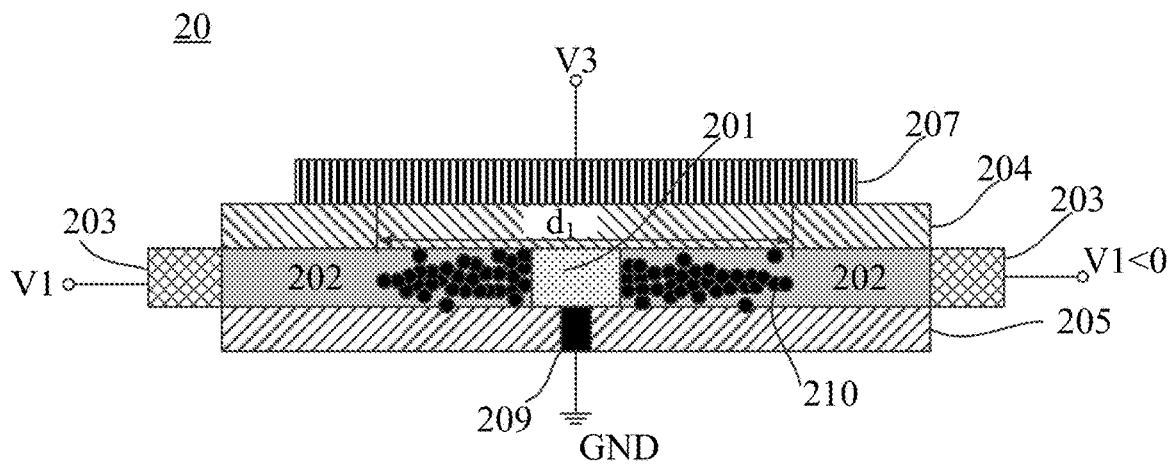
FIG. 2 is a working principle diagram of the memcapacitor of FIG. 1.

In FIG. 2, the source electrode 201 is grounded, and a voltage signal V1 is applied to the programming electrode 203, V1<0. In this case, the metal cations 210 inside the source electrode 201 migrate outward in the horizontal direction, and the effective size of the source electrode 201 is increased from $d_0$ to $d_1$, where $d_0$ is the effective size of the source electrode 201 when the metal cations 210 do not migrate.

Figure 3:
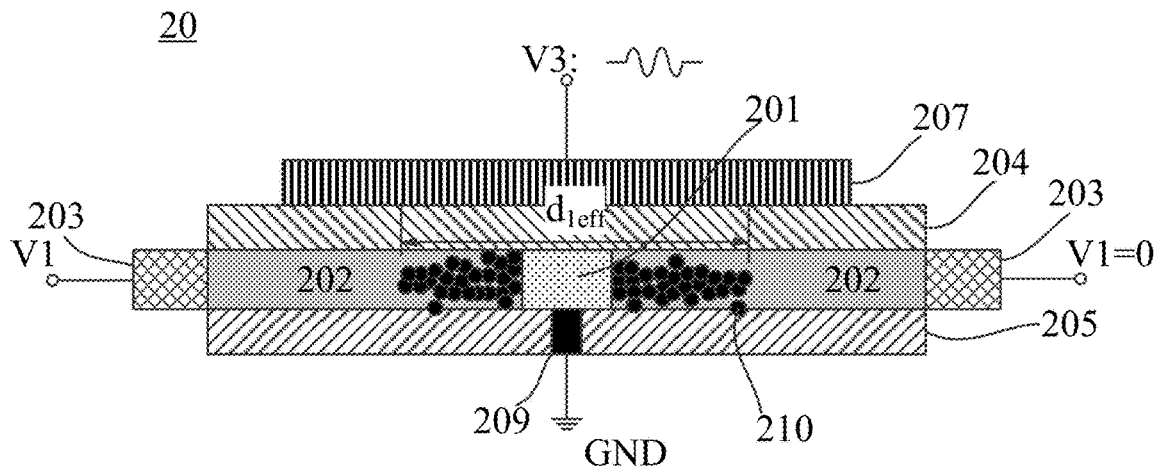
FIG. 3 is a working principle diagram of the memcapacitor of FIG. 1.

In FIG. 3, the voltage signal V1 on the programming electrode 203 is disconnected, and the metal cations 210 stop migrating. However, due to a relaxation process, a part of the metal cations 210 may contract inward, and in this case, the effective size of the source electrode is reduced from $d_1$ to $d_{1eff}$.

While V1 is disconnected, the capacitance value of the capacitor 200 is measured when the effective size of the source electrode 201 is $d_{1eff}$. Specifically, an alternating current voltage signal V3 is applied to the reading electrode 207, for example, with a frequency of 1 kHz and a read voltage of 0.03V, for reading the capacitance value of the capacitor 200, which is recorded as a first capacitance value.

After the capacitance value is read, the alternating current voltage signal V3 applied to the reading electrode 207 is disconnected.

Figure 4:
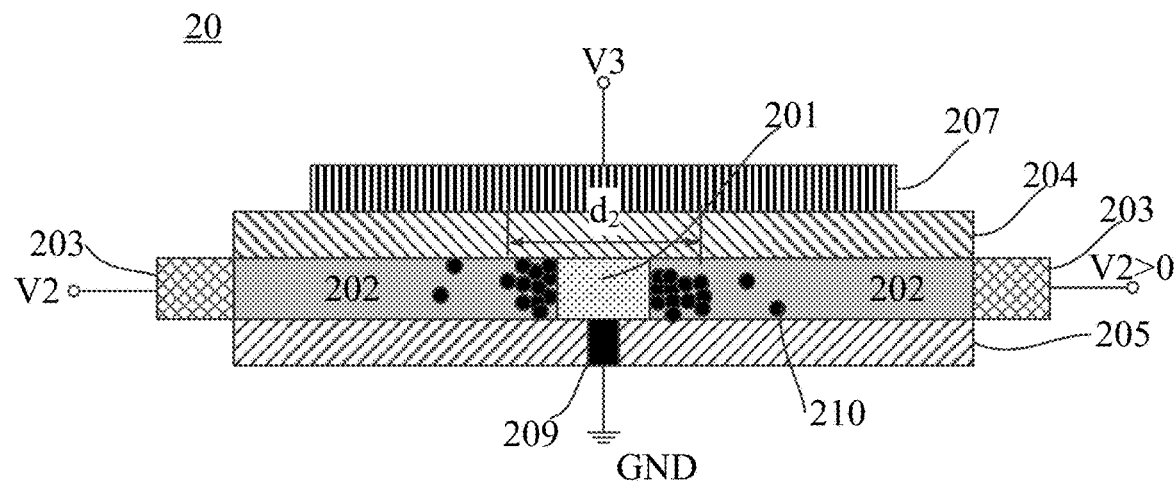
FIG. 4 is a working principle diagram of the memcapacitor of FIG. 1.

In FIG. 4, a voltage signal V2 is applied to the programming electrode 203, V2>0. In this case, the metal cations 210 inside the source electrode 201 migrate inward in the horizontal direction, and the effective size of the source electrode is reduced from $d_{1\mathit{eff}}$ to $d_2$.

Figure 5:
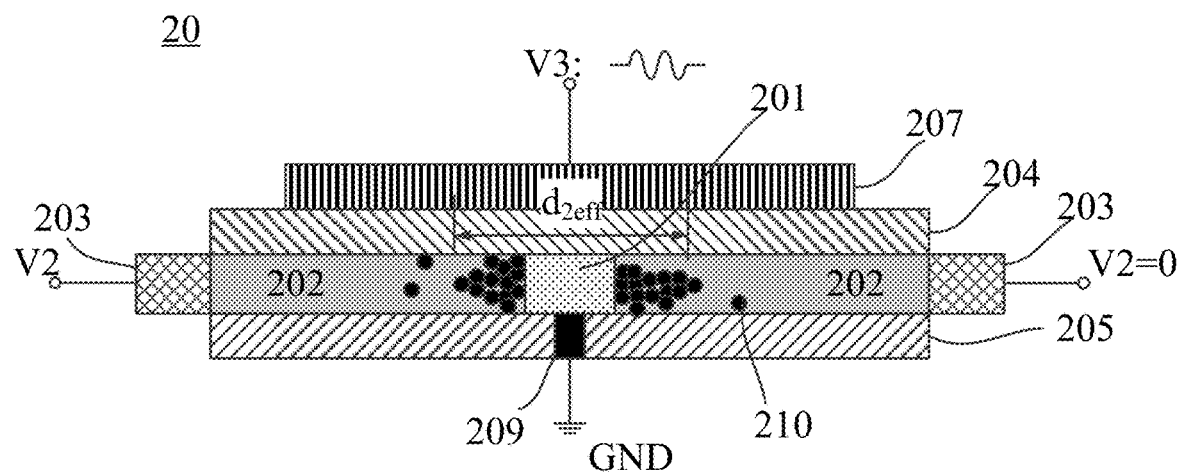
FIG. 5 is a working principle diagram of the memcapacitor of FIG. 1.

In FIG. 5, the voltage signal V2 on the programming electrode 203 is disconnected, and the metal cations 210 stop migrating. Similarly, due to the relaxation process, a part of the metal cations 210 may expand outward, and in this case, the size of the source electrode is increased from $d_2$ to $d_{2\mathit{eff}}$.

While V2 is disconnected, the capacitance value of the capacitor 200 is measured when the effective size of the source electrode is $d_{2\mathit{eff}}$. Specifically, an alternating current voltage signal V3 is applied to the reading electrode 207, for example, with a frequency of 1 kHz and a read voltage of 0.03 V, for reading the capacitance value of the capacitor 200, which is recorded as a second capacitance value. After the capacitance value is read, the alternating current voltage signal V3 applied to the reading electrode 207 is disconnected.

In this embodiment, with the $d_{2\mathit{eff}} < d_{1\mathit{eff}}$, it may be determined that the first capacitance value is greater than the second capacitance value, and it may be set that the first capacitance value is a high capacitance value and the second capacitance value is a low capacitance value, and they correspond to the storage states "1" and "0", respectively. Therefore, repeated switching of a high capacitance status or a low capacitance status of the capacitor could be achieved by controlling a voltage signal applied to the programming electrode 203, thereby achieving non-volatile storage of data "0" and "1" in the memcapacitor.

Figure 6:
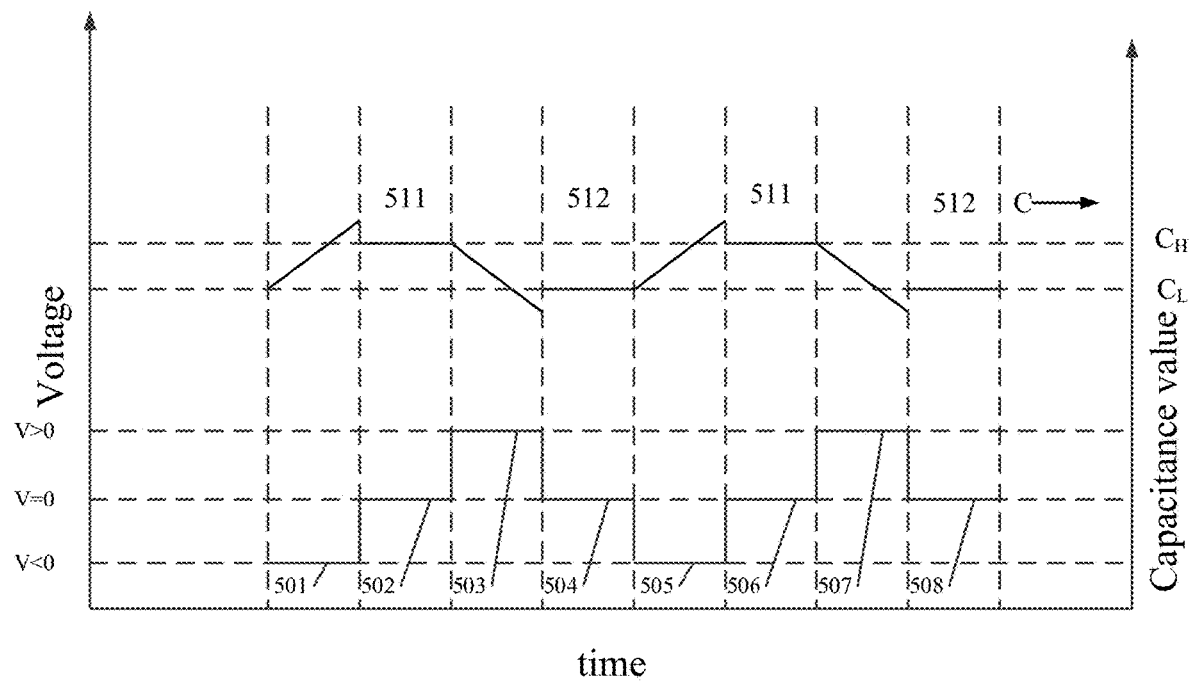
FIG. 6 is a working timing diagram of two-level storage of a memcapacitor.

FIG. 6 is a working timing diagram of a memcapacitor in a two-level storage scene. Specifically, FIG. 6 is a diagram of a relationship among a capacitance value of a capacitor, a voltage signal applied to a programming electrode (that is, a program voltage) and a clock signal, where an abscissa is time, an ordinate on the left side is the program voltage, a corresponding curve of which is located at a lower position in FIG. 6, and an ordinate on the right side is the capacitance value of the capacitor, a corresponding curve of which is located at an upper position in FIG. 6.

It should be understood that in FIG. 6, 501~504 are an erase and write cycle (or referred to as a program cycle), and 505~508 are another erase and write cycle. Certainly, more erase and write cycles may be included, and here only 501~504 are taken as an example for description.

In 501, a voltage signal less than zero is applied to the programming electrode, an effective size of a source electrode is gradually increased, and the capacitance value of the capacitor is gradually increased, which correspond to the control process shown in FIG. 2.

In 502, the voltage signal on the programming electrode is disconnected, and the size of the source electrode shrinks slightly due to a relaxation process, and at this time, the capacitance value of the capacitor is in a high capacitance status 511, which correspond to the control process shown in FIG. 3.

In 503, a voltage signal greater than zero is applied to the programming electrode, the effective size of the source electrode is gradually reduced, and the capacitance value of the capacitor is gradually reduced, which correspond to the control process shown in FIG. 4.

In 504, the voltage signal on the programming electrode is disconnected, and the size of the source electrode expands slightly due to the relaxation process, and at this time, the capacitance value of the capacitor is in a low capacitance status 512, which correspond to the control process shown in FIG. 5.

Therefore, repeated erasing and writing and reading of data "0" and "1" in the memcapacitor may be achieved by performing the foregoing working process cyclically.

It should be understood that the working timing of the memcapacitor shown in FIG. 6 is only an example, the embodiment of the present disclosure may adjust the foregoing working process to implement continuous writing of "0", or continuous writing of "1", or writing of "1" first and then writing of "0", or other timings, which will not be repeated redundantly herein.

Optionally, in the embodiment of the present disclosure, the memcapacitor 20 may further include:

a driving module configured to control, by controlling a voltage parameter of the voltage signal applied to the programming electrode, a migration distance of the metal cations in the horizontal direction so as to control the effective electrode area of the capacitor.

By way of example but not limitation, the voltage parameter includes a type of voltage and/or a corresponding control parameter, the type of voltage is a direct current voltage or a pulse voltage, a control parameter of the direct current voltage includes at least one of a voltage amplitude, a voltage applying time and a voltage applying manner (for example, stepping voltage applying or linear voltage applying), and a control parameter of the pulse voltage includes at least one of a number of pulse voltages, an amplitude and a width of the pulse voltage.

That is, in the embodiment of the present disclosure, different capacitance value status of the capacitor correspond to different storage states of the memcapacitor. By controlling the voltage parameter of the voltage signal applied to the programming electrode, for example, the number of pulse voltages, the amplitude or the width of the pulse voltage, the capacitor presents different capacitance values, thereby achieving the corresponding storage states of the memcapacitor.

Figure 7:
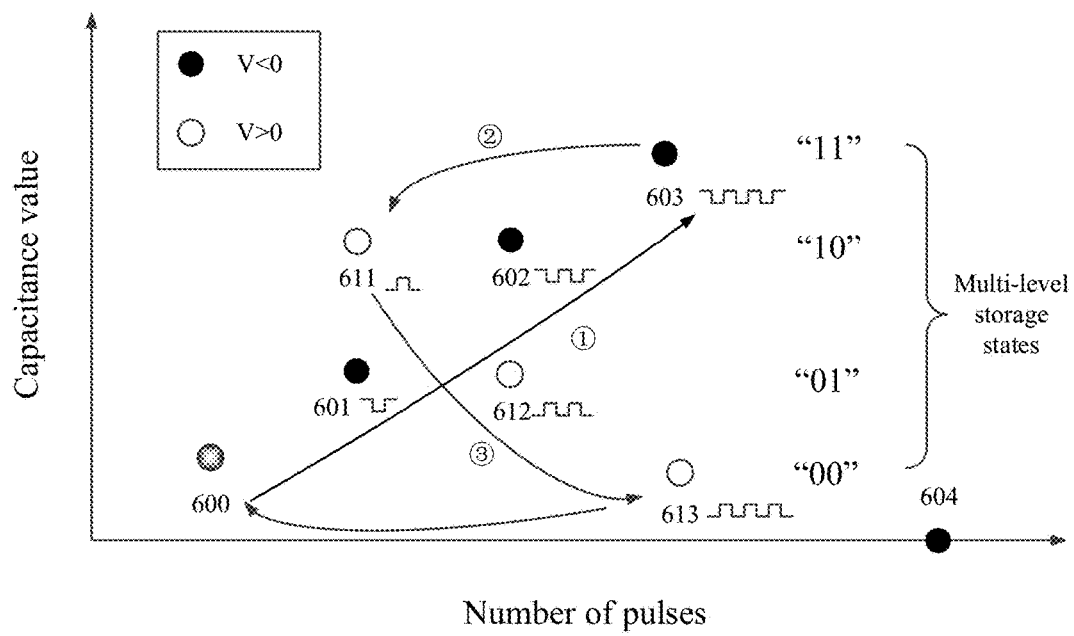
FIG. 7 is a working principle diagram of multi-level storage of a memcapacitor.

Four-level storage is taken as an example below to illustrate a working principle of multi-level storage of the memcapacitor with reference to FIG. 7. It should be understood that the example shown in FIG. 7 is to make the capacitor have different capacitance values by controlling a number of pulse voltage signals applied to the programming electrode, thereby achieving the multi-level storage of the memcapacitor. Certainly, the foregoing process may be achieved by controlling other voltage parameters applied to the programming electrode, which will not be repeated redundantly herein.

Specifically, when no voltage signal is applied to the programming electrode, that is, when there is no voltage difference between the programming electrode and the source electrode, an initial capacitance value of the capacitor is at 600, which is denoted as C1.

When a pulse voltage signal V is applied to the programming electrode, V<0, the capacitance value of the capacitor is increased to 601, which is denoted as C2. Alternatively, when two or three pulse voltage signals V are applied to the programming electrodes, V<0, the capacitance value of the capacitor is increased to 602 or 603, respectively, which is denoted as C3 or C4, respectively.

It should be understood that when the number of pulse voltage signals is greater than a certain threshold (for example, 10), the capacitance value of the capacitor is reduced to zero because the voltage is excessive to cause the metal cations to move to the programming electrode such that the programming electrode and the source electrode are conducted.

Similarly, when one pulse voltage signal V is applied to the programming electrode, V>0, the capacitance value of the capacitor falls from 603 to 611, which is denoted as C5. Alternatively, when two or three pulse voltage signals V are applied to the programming electrodes, V>0, the capacitance value of the capacitor falls to 612 or 613, which is denoted as C6 or C7, respectively.

In this embodiment, the foregoing capacitance values satisfy the following relationship: C4>C3≈C5>C6≈C2>C7≈C1.

It can be understood that the capacitor has four capacitance values, or has four capacitance value status, and the four capacitance values may be set to correspond to four storage states, respectively. For example, the correspondence may be set as follows:

C4 corresponds to a storage state "11";
C3 and C5 correspond to a storage state "10";
C2 and C6 correspond to a storage state "01"; and
C1 and C7 corresponds to a storage state "00".

Therefore, in the embodiment of the present disclosure, different capacitance value status of the capacitor may correspond to different storage states of the memcapacitor. Thus, by controlling the voltage parameter of the voltage signal applied to the programming electrode, for example, the number of pulse voltages, the amplitude or the width of the pulse voltage, the capacitor is in different capacitance value status, thereby achieving multi state storage of the memcapacitor.

It should be noted that, in the embodiment of the present disclosure, the driving module may further control the voltage parameter of the voltage signal such that a maximum migration distance of the metal cations in the first dielectric layer is less than a distance threshold to avoid conduction between the source electrode and the programming electrode due to moving of the metal cations to the programming electrode, and influence on storage of data.

Optionally, the distance threshold is 70% of a size of the first dielectric layer in the horizontal direction, that is, the metal cations move in the first dielectric layer farthest to 70% of the size of the first dielectric layer in the horizontal dimension.

It should be understood that, in the embodiment of the present disclosure, a thickness of the first dielectric layer is the same as a thickness of the source electrode to avoid moving of the metal cations in the source electrode out of the first dielectric layer in migration, and influence on control of the effective area of the source electrode.

Optionally, in the embodiment of the present disclosure, a thickness of the programming electrode and the thickness of the first dielectric layer may be the same, or may be different, which is not limited in the embodiment of the present disclosure.

Optionally, in the embodiment of the present disclosure, mobility of the metal cations 210 in the first dielectric layer 202 is greater than mobility of the metal cations 210 in the second dielectric layer 204 and in the third dielectric layer 205. It can be understood that the first dielectric layer 202 is a transportation layer of the metal cations 210, and the second dielectric layer 204 and the third dielectric layer 205 are confinement layers of the metal cations 210.

In a specific embodiment, ratios of the mobility of the metal cations 210 in the first dielectric layer 202 to the mobility of the metal cations 210 in the second dielectric layer 204 and in the third dielectric layer 205 are greater than 10.

Optionally, in the embodiment of the present disclosure, a lower surface of the second dielectric layer 204 at least covers the upper surface of the source electrode 201 and the upper surface of first dielectric layer 202 so as to avoid moving of the metal cations 210 of the source electrode 201 to the reading electrode 204, conduction between the source electrode 201 and the read electrode 207, and influence on reading of data in the memcapacitor.

Optionally, in the embodiment of the present disclosure, an upper surface of the third dielectric layer 205 at least covers a lower surface of the source electrode 201 and a lower surface of the first dielectric layer 202.

Optionally, in some embodiments, the thickness of the first dielectric layer 202 ranges from 10 to 100 times a radius of a metal cation 210.

By way of example and not limitation, the source electrode 201 may be made of a metal material such as silver or copper. Correspondingly, the metal cations may be silver ions ($Ag^+$), copper ions ($Cu^{2+}$) or the like.

By way of example and not limitation, the programming electrode 203 may be made of a noble metal material having good chemical stability, such as platinum (Pt), palladium (Pd) or gold (Au).

By way of example and not limitation, the reading electrode 207 may also be made of a noble metal material having good chemical stability, such as platinum (Pt), palladium (Pd) or gold (Au).

By way of example and not limitation, the conductive through hole 209 may be made of metal or a semiconductor material having good electrical conductivity, such as tungsten (W), copper (Cu) or polysilicon.

By way of example and not limitation, a material of the first dielectric layer 202 may be silicon dioxide ($SiO_2$) or another semiconductor material in which metal cations have less mobility.

Optionally, the second dielectric layer 204 and the third dielectric layer 205 may be made of the same material, or may be made of different materials, which is not limited in the embodiment of the present disclosure.

By way of example and not limitation, the second dielectric layer 204 and the third dielectric layer 205 may be made of one of the following materials: metal oxide materials or metal nitride materials, such as aluminum oxide ($Al_2O_3$), zirconium oxide ($ZrO_2$), hafnium oxide ($HfO_2$), tantalum oxide ($Ta_2O_5$) or aluminum nitride (AlN).

Therefore, the memcapacitor of the embodiment of the present disclosure may change the capacitance value of the capacitor by changing the effective electrode area of the capacitor, and the materials of the respective structural members in the memcapacitor are common materials in the field of semiconductor industry, which could solve a problem of a complicated process due to high requirements for dielectric materials in a preparation process of an existing memcapacitor.

Figure 8:
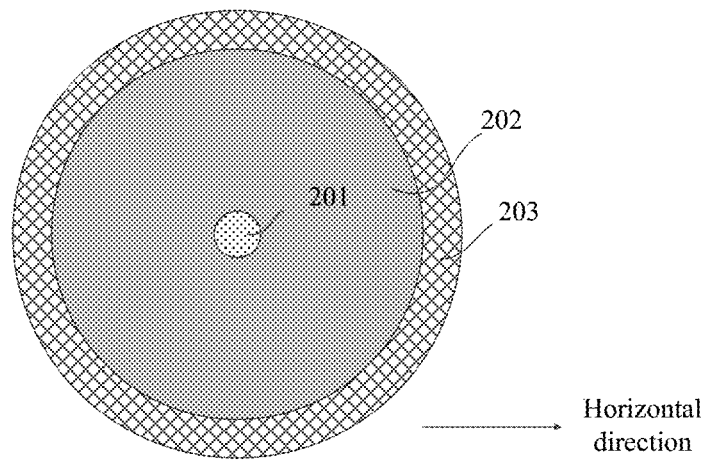
FIG. 8 is a schematic diagram of a specific structure of the memcapacitor of FIG. 1.
Figure 9:
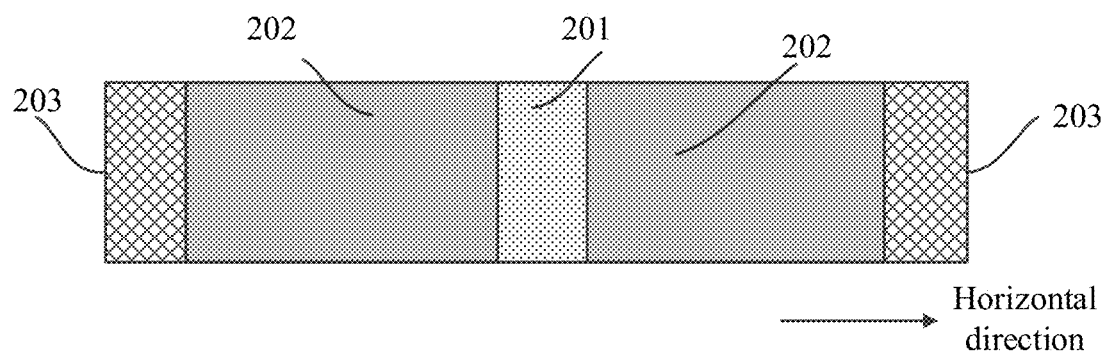
FIG. 9 is a schematic diagram of another specific structure of the memcapacitor of FIG. 1.

FIG. 8 and FIG. 9 show two layout design schemes of the memcapacitor 20 of FIG. 1. It should be understood that FIG. 8 and FIG. 9 are cross-sectional views of the memcapacitor 20 in a horizontal direction of a source electrode.

As shown in FIG. 8, as viewed from a cross section in the horizontal direction of the source electrode, a source electrode 201, a first dielectric layer 202 and a programming electrode 203 in the memcapacitor may be concentric circles from inside to outside, that is, the source electrode 201 is an innermost circle, the first dielectric layer 202 is a circular ring surrounding the source electrode 201, and the programming electrode 203 is a circular ring surrounding the first dielectric layer 202.

As shown in FIG. 9, as viewed from a cross section in the horizontal direction of the source electrode, the source electrode 201, the first dielectric layer 202 and the programming electrode 203 may be axisymmetric in shape. Specifically, the source electrode may be a rectangular at a middle position, the first dielectric layer 202 is divided into two parts symmetrically distributed on two sides of the source electrode 201, and the programming electrode 203 is also divided into two parts symmetrically distributed on outer sides of the two parts of the first dielectric layer 202.

It should be noted that the structures of the memcapacitor shown in FIG. 8 and FIG. 9 are merely possible implementation manners or preferred implementation manners of the memcapacitor structure according to an embodiment of the present disclosure. Other implementation manners resulting from the memcapacitor structure according to the embodiment of the present disclosure also fall within the protection scope of the embodiment of the present disclosure.

Figure 10:
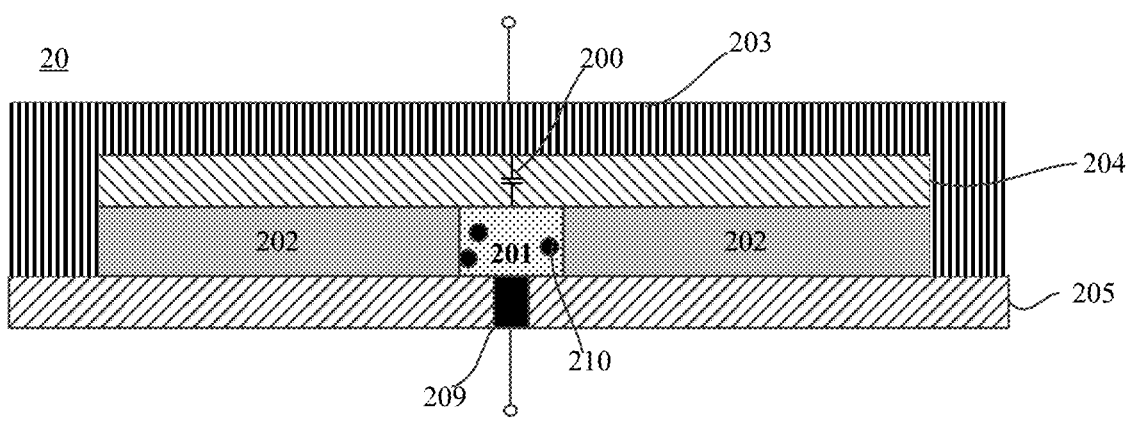
FIG. 10 is a schematic structural diagram of a memcapacitor according to another embodiment of the present disclosure.

FIG. 10 is a schematic structural diagram of a memcapacitor according to another embodiment of the present disclosure. In the memcapacitor 20, the programming electrode 203 and the reading electrode 207 are combined into a same electrode, and in this way, a number of ports of the memcapacitor is reduced from three to two and the structure is simpler, which benefit improvement of integration of a device.

It should be understood that in the example shown in FIG. 1, external ports of the memcapacitor include three ports of the source electrode, the programming electrode and the reading electrode. In the example shown in FIG. 10, external ports of the memcapacitor include two ports of the source electrode and the combined electrode of the programming electrode and the reading electrode.

It should be noted that, in the embodiment of the present disclosure, when a program voltage is much greater than a read voltage (for example, a ratio of the program voltage to the read voltage is greater than or equal to 10), the read voltage applied may not significantly affect an effective area of the source electrode in reading data, and thus the reading electrode and the programming electrode may be combined into a same electrode.

The structures and working principles of the memcapacitor according to the embodiments of the present disclosure are described above in detail with reference to FIG. 1 to FIG. 10. A method embodiment according to the present disclosure is described below with reference to FIG. 11. It should be understood that the method embodiment and the apparatus embodiment correspond to each other, and for similar descriptions, reference is made to the apparatus embodiment, which will not be repeated redundantly herein.

FIG. 11 is a schematic flow chart of a programming method 70 for a memcapacitor according to an embodiment of the present disclosure. The programming method 70 may be applied to a memcapacitor, the memcapacitor includes:

a source electrode made of a metal material;

a first dielectric layer disposed at an outer side of the source electrode in a horizontal direction;

a programming electrode disposed at an outer side of the first dielectric layer in the horizontal direction;

a second dielectric layer disposed at an upper surface of the source electrode and an upper surface of the first dielectric layer; and a reading electrode disposed at an upper surface of the second dielectric layer, where the reading electrode, the second dielectric layer and the source electrode form a capacitor; and as shown in FIG. 11, the method 70 may include:

S71, applying a voltage difference between the source electrode and the programming electrode to change an effective electrode area of the capacitor.

Optionally, the memcapacitor may be the memcapacitor 20 of the embodiments of the present disclosure. For the specific structure, reference may be made to the related descriptions of the foregoing embodiments, which will not be repeated redundantly herein.

Optionally, in some embodiments, S71 specifically includes:

controlling, by controlling a voltage parameter of a voltage signal applied to the programming electrode, a migration distance of metal cations in the source electrode in the horizontal direction so as to control the effective electrode area of the capacitor, where different capacitance values of the capacitor correspond to different storage states of the memcapacitor.

Optionally, in some embodiments, the voltage parameter includes a type of voltage and/or a corresponding control parameter, the type of voltage is a direct current voltage or a pulse voltage, a control parameter of the direct current voltage includes at least one of a voltage amplitude, a voltage applying time and a voltage applying manner, and a control parameter of the pulse voltage includes at least one of a number of pulse voltages, an amplitude and a width of the pulse voltage.

Optionally, the controlling, by controlling the voltage parameter of the voltage signal applied to the programming electrode, the migration distance of the metal cations in the source electrode in the horizontal direction includes:

inputting a first voltage signal to the programming electrode during a first time period, where a voltage value of the first voltage signal is less than zero, the source electrode is grounded, the metal cations in the source electrode migrate outward in the horizontal direction, and a size of the source electrode in the horizontal direction is increased from a first size to a second size;

disconnecting the first voltage signal during a second time period, where the metal cations in the source electrode stop migrating, and the size of the source electrode in the horizontal direction is reduced from the second size to a second effective size, where a capacitance value of the capacitor corresponds to a first storage state of at least two storage states of the memcapacitor when the size of the source electrode in the horizontal direction is the second effective size;

inputting a second voltage signal to the programming electrode during a third time period, where a voltage value of the second voltage signal is greater than zero, the source electrode is grounded, the metal cations in the source electrode migrate inward in the horizontal direction, and the size of the source electrode in the horizontal direction is reduced from a third size to a fourth size; and disconnecting the second voltage signal during a fourth time period, where the metal cations in the source electrode stop migrating, and the size of the source electrode in the horizontal direction is increased from the fourth size to a fourth effective size, where the capacitance value of the capacitor corresponds to a second storage state of the at least two storage states of the memcapacitor when the size of the source electrode in the horizontal direction is the fourth effective size. Optionally, in some embodiments, the at least two storage states include a storage state 0 and a storage state 1, the first storage state is the storage state 1, and the second storage state is the storage state 0.

Optionally, the controlling, by controlling the voltage parameter of the voltage signal applied to the programming electrode, the migration distance of the metal cations in the source electrode in the horizontal direction includes:

controlling, by controlling the voltage parameter of the voltage signal input to the programming electrode, a maximum migration distance of the metal cations in the first dielectric layer to be not more than 70% of a size of the first dielectric layer in the horizontal direction.

Optionally, in some embodiments, the memcapacitor further includes:

a third dielectric layer disposed at a lower surface of the source electrode and a lower surface of the first dielectric layer; and a conductive through hole disposed in the third dielectric layer and located under the source electrode for connecting the source electrode to an external voltage.

Optionally, in some embodiments, mobility of metal cations in the source electrode in the first dielectric layer is greater than mobility of the metal cations in the second dielectric layer, and the mobility of the metal cations in the first dielectric layer is greater than mobility of the metal cations in the third dielectric layer.

Optionally, in some embodiments, a ratio of the mobility of the metal cations in the first dielectric layer to the mobility of the metal cations in the second dielectric layer is greater than or equal to 10, and a ratio of the mobility of the metal cations in the first dielectric layer to the mobility of the metal cations in the third dielectric layer is greater than or equal to 10.

Optionally, in some embodiments, the reading electrode is connected with the programming electrode.

Optionally, in some embodiments, the reading electrode and the programming electrode are connected as one electrode in a case that a ratio of a program voltage to a read voltage is greater than or equal to 10.

Optionally, in some embodiments, the first dielectric layer surrounds the source electrode, and the programming electrode surrounds the first dielectric layer.

Optionally, in some embodiments, a thickness of the first dielectric layer is the same as a thickness of the source electrode, and a thickness of the programming electrode is the same as the thickness of the source electrode.

An embodiment of the present disclosure further provides a capacitive random access memory CRAM, as shown in FIG. 12. A capacitive random access memory 80 includes a memcapacitor array 81, the memcapacitor array 81 may be an array composed of several memcapacitors 20 according to the embodiment of the present disclosure, and each memcapacitor unit in the memcapacitor array 81 may perform storage of data using the programming method 70 shown in FIG. 11.

An embodiment of the present disclosure further provides a computer readable storage medium, where the computer readable storage medium stores one or more programs, and the one or more programs include an instruction. When the instruction is executed by a portable electronic device that includes a plurality of application programs, the portable electronic device can execute the method of the embodiment shown in FIG. 11.

An embodiment of the present disclosure further provides a computer program including instructions that, when executed by a computer, cause the computer to execute the method of the embodiment shown in FIG. 11.

An embodiment of the present disclosure further provides a chip including an input and output interface, at least one processor, at least one memory and a bus, where the at least one memory is configured to store an instruction, the at least one processor is configured to call an instruction in the at least one memory to execute the method of the embodiment shown in FIG. 11.

It should be understood that, in various embodiments of the present disclosure, values of sequence numbers of the foregoing various processes do not mean an order of execution which should be determined based upon functionalities and internal logics thereof, rather than setting any limitation to implementation of the embodiments of the present disclosure.

Those of ordinary skill in the art may be aware that, units and algorithm steps of the examples described in the embodiments disclosed herein may be implemented by electronic hardware, or a combination of computer software and computer software. Whether these functions are executed in hardware or software mode depends on the specific applications and design constraint conditions of the technical solution. Those skilled may implement the described functions by using different methods for each specific application, but this implementation should not be considered to be beyond the scope of the present disclosure.

Those skilled in the art to which the present disclosure pertains may clearly understand that, for convenience and simplicity of description, the specific working processes of the system, the apparatus and the units described above, may refer to corresponding processes in the foregoing method embodiments, and will not be repeated redundantly herein.

In the several embodiments provided in the present disclosure, it should be understood that the disclosed system, apparatus, and method may be implemented in another manner. For example, the described apparatus embodiment is merely an example. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented by using some interfaces. The indirect couplings or communication connections between the apparatuses or units may be implemented in electrical, mechanical, or other forms.

The units described as separate components may or may not be physically separate, and components displayed as units may or may not be physical units, may be located in one position, or may be distributed on multiple network units. Some or all of the units may be selected according to actual requirements to achieve the objectives of the solutions of the embodiments.

In addition, functional units in the embodiments of the present disclosure may be integrated into one processing unit, or each of the units may exist alone physically, or two or more units are integrated into one unit.

When the functions are implemented in the form of a software functional unit and sold or used as an independent product, the functions may be stored in a computer-readable storage medium. Based on such an understanding, the technical solutions of the present disclosure essentially, or the part contributing to the prior art, or some of the technical solutions may be implemented in a form of a software product. The computer software product is stored in a storage medium and includes several instructions for instructing a computer device (which may be a personal computer, a server, a network device, or the like) to perform all or some of the steps of the methods described in the embodiments of the present disclosure. The foregoing storage medium includes: any medium that can store program code, such as a USB flash drive, a removable hard disk, a read-only memory (ROM), a random access memory (RAM), a magnetic disk, or an optical disc.

The foregoing descriptions are merely specific embodiments of the present disclosure, but the protection scope of the present disclosure is not limited thereto, persons skilled in the art who are familiar with the art could readily think of variations or substitutions within the technical scope disclosed by the present disclosure, and these variations or substitutions shall fall within the protection scope of the present disclosure. Therefore, the protection scope of the present disclosure shall be subject to the protection scope of the claims.

What is claimed is:

1. A memcapacitor, comprising:
a source electrode made of a metal material;
a first dielectric layer disposed at an outer side of the source electrode in a horizontal direction;
a programming electrode disposed at an outer side of the first dielectric layer in the horizontal direction;
a second dielectric layer disposed at an upper surface of the source electrode and an upper surface of the first dielectric layer; and
a reading electrode disposed at an upper surface of the second dielectric layer, wherein the reading electrode, the second dielectric layer and the source electrode form a capacitor.

2. The memcapacitor according to claim 1, wherein the memcapacitor further comprises:
a third dielectric layer disposed at a lower surface of the source electrode and a lower surface of the first dielectric layer; and
a conductive through hole disposed in the third dielectric layer and located under the source electrode for connecting the source electrode to an external voltage.

3. The memcapacitor according to claim 2, wherein the third dielectric layer at least covers the lower surface of the source electrode and the lower surface of the first dielectric layer.

4. The memcapacitor according to claim 2, wherein mobility of metal cations in the first dielectric layer is greater than mobility of the metal cations in the second dielectric layer, and the mobility of the metal cations in the first dielectric layer is greater than mobility of the metal cations in the third dielectric layer, wherein the metal cations are generated by the source electrode.

5. The memcapacitor according to claim 4, wherein a ratio of the mobility of the metal cations in the first dielectric layer to the mobility of the metal cations in the second dielectric layer is greater than or equal to 10, and a ratio of the mobility of the metal cations in the first dielectric layer to the mobility of the metal cations in the third dielectric layer is greater than or equal to 10.

6. The memcapacitor according to claim 1, wherein the second dielectric layer at least covers the upper surface of the source electrode and the upper surface of the first dielectric layer.

7. The memcapacitor according to claim 1, wherein an area of a lower surface of the reading electrode is larger than twice an area of the upper surface of the source electrode in a case that there is no voltage difference between the source electrode and the programming electrode.

8. The memcapacitor according to claim 1, wherein a thickness of the first dielectric layer ranges from 10 to 100 times a radius of a metal cation in the source electrode.

9. The memcapacitor according to claim 1, wherein the memcapacitor further comprises:
a driving module configured to control, by applying a voltage signal to the programming electrode, metal cations in the source electrode to migrate in the horizontal direction so as to change an effective electrode area of the capacitor, wherein different capacitance values of the capacitor correspond to different storage states of the memcapacitor.

10. The memcapacitor according to claim 9, wherein the driving module is configured to:
control, by controlling a voltage parameter of the voltage signal applied to the programming electrode, a migration distance of the metal cations in the horizontal direction so as to control the effective electrode area of the capacitor.

11. The memcapacitor according to claim 10, wherein the voltage parameter comprises a type of voltage and/or a corresponding control parameter, the type of voltage is a direct current voltage or a pulse voltage, a control parameter of the direct current voltage comprises at least one of a voltage amplitude, a voltage applying time and a voltage applying manner, and a control parameter of the pulse voltage comprises at least one of a number of pulse voltages, an amplitude and a width of the pulse voltage.

12. The memcapacitor according to claim 9, wherein the driving module is configured to:
input a first voltage signal to the programming electrode during a first time period, wherein a voltage value of the first voltage signal is less than zero, the source electrode is grounded, the metal cations in the source electrode migrate outward in the horizontal direction, and a size of the source electrode in the horizontal direction is increased from a first size to a second size,
disconnect the first voltage signal during a second time period, wherein the metal cations in the source electrode stop migrating, and the size of the source electrode in the horizontal direction is reduced from the second size to a second effective size, wherein a capacitance value of the capacitor corresponds to a first storage state of at least two storage states of the memcapacitor when the size of the source electrode in the horizontal direction is the second effective size; or
input a second voltage signal to the programming electrode during a third time period, wherein a voltage value of the second voltage signal is greater than zero, the source electrode is grounded, the metal cations in the source electrode migrate inward in the horizontal direction, and the size of the source electrode in the horizontal direction is reduced from a third size to a fourth size,
disconnect the second voltage signal during a fourth time period, wherein the metal cations in the source electrode stop migrating, and the size of the source electrode in the horizontal direction is increased from the fourth size to a fourth effective size, wherein the capacitance value of the capacitor corresponds to a second storage state of the at least two storage states of the memcapacitor when the size of the source electrode in the horizontal direction is the fourth effective size.

13. The memcapacitor according to claim 12, wherein the at least two storage states comprise a storage state 0 and a storage state 1, the first storage state is the storage state 1, and the second storage state is the storage state 0.

14. The memcapacitor according to claim 13, wherein the reading electrode is connected with the programming electrode.

15. The memcapacitor according to claim 14, wherein the reading electrode and the programming electrode are connected as one electrode in a case that a ratio of a program voltage to a read voltage is greater than or equal to 10.

16. The memcapacitor according to claim 1, wherein the first dielectric layer surrounds the source electrode, and the programming electrode surrounds the first dielectric layer.

17. The memcapacitor according to claim 1, wherein a thickness of the first dielectric layer is the same as a thickness of the source electrode, and a thickness of the programming electrode is the same as the thickness of the source electrode.

18. A programming method for a memcapacitor, wherein the memcapacitor comprises:
   a source electrode made of a metal material;
   a first dielectric layer disposed at an outer side of the source electrode in a horizontal direction;
   a programming electrode disposed at an outer side of the first dielectric layer in the horizontal direction;
   a second dielectric layer disposed at an upper surface of the source electrode and an upper surface of the first dielectric layer; and
   a reading electrode disposed at an upper surface of the second dielectric layer, wherein the reading electrode, the second dielectric layer and the source electrode form a capacitor; and
   the method comprises:
   applying a voltage difference between the source electrode and the programming electrode to change an effective electrode area of the capacitor.

19. The programming method according to claim 18, wherein the applying the voltage difference between the source electrode and the programming electrode to change the effective electrode area of the capacitor comprises:
   controlling, by controlling a voltage parameter of a voltage signal applied to the programming electrode, a migration distance of metal cations in the source electrode in the horizontal direction so as to control the effective electrode area of the capacitor, wherein different capacitance values of the capacitor correspond to different storage states of the memcapacitor, wherein the voltage parameter comprises a type of voltage and/or a corresponding control parameter, the type of voltage is a direct current voltage or a pulse voltage, a control parameter of the direct current voltage comprises at least one of a voltage amplitude, a voltage applying time and a voltage applying manner, and a control parameter of the pulse voltage comprises at least one of a number of pulse voltages, an amplitude and a width of the pulse voltage.

20. A capacitive random access memory comprising:
   a memcapacitor array, wherein the memcapacitor array is an array composed of a plurality of memcapacitors, each of the memcapacitors comprises:
   a source electrode made of a metal material;
   a first dielectric layer disposed at an outer side of the source electrode in a horizontal direction;
   a programming electrode disposed at an outer side of the first dielectric layer in the horizontal direction;
   a second dielectric layer disposed at an upper surface of the source electrode and an upper surface of the first dielectric layer; and
   a reading electrode disposed at an upper surface of the second dielectric layer, wherein the reading electrode, the second dielectric layer and the source electrode form a capacitor.

* * * * *